(12) United States Patent
Cui et al.

(10) Patent No.: US 12,297,375 B2
(45) Date of Patent: May 13, 2025

(54) SLURRY COMPOSITION AND METHOD FOR POLISHING AND INTEGRATED CIRCUIT

(71) Applicant: TAIWAN SEMICONDUCTOR MANUFACTURING COMPANY LTD., Hsinchu (TW)

(72) Inventors: Ji Cui, Bolingbrook, IL (US); Chi-Jen Liu, Taipei (TW); Liang-Guang Chen, Hsinchu (TW); Kei-Wei Chen, Tainan (TW); Chun-Wei Hsu, Hsinchu (TW); Li-Chieh Wu, Hsinchu (TW); Peng-Chung Jangjian, Hsinchu (TW); Kao-Feng Liao, Hsinchu (TW); Fu-Ming Huang, Changhua County (TW); Wei-Wei Liang, Hsinchu (TW); Tang-Kuei Chang, Tainan (TW); Hui-Chi Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 154 days.

(21) Appl. No.: 17/141,988

(22) Filed: Jan. 5, 2021

(65) Prior Publication Data

US 2021/0371702 A1 Dec. 2, 2021

Related U.S. Application Data

(60) Provisional application No. 63/031,505, filed on May 28, 2020.

(51) Int. Cl.
*C09G 1/02* (2006.01)
*H01L 21/321* (2006.01)
(Continued)

(52) U.S. Cl.
CPC .......... *C09G 1/02* (2013.01); *H01L 21/3212* (2013.01); *H01L 21/76805* (2013.01);
(Continued)

(58) Field of Classification Search
CPC .......... C09G 1/02; C09G 1/04; H01L 21/3212
See application file for complete search history.

(56) References Cited

U.S. PATENT DOCUMENTS

| 2010/0029079 A1* | 2/2010 | Ghosh | C09G 1/02 438/692 |
| 2010/0087065 A1* | 4/2010 | Boggs | C09K 3/1463 438/692 |

(Continued)

OTHER PUBLICATIONS

Wikipedia, "Poise (unit)" via https://en.wikipedia.org/wiki/Poise_(unit) ; pp. 1-2; (Year: 2022).*

(Continued)

*Primary Examiner* — Binh X Tran
(74) *Attorney, Agent, or Firm* — WPAT LAW; Anthony King

(57) ABSTRACT

A slurry composition, a polishing method and an integrated circuit are provided. The slurry composition includes a slurry and at least one rheology modifier. The slurry includes at least one liquid carrier, at least one abrasives and at least one oxidizer. The rheology modifier is dispensed in the slurry. The polishing method includes using the slurry composition with the rheology modifier to polish a conductive layer.

20 Claims, 19 Drawing Sheets

(51) Int. Cl.
H01L 21/768 (2006.01)
H01L 23/535 (2006.01)

(52) U.S. Cl.
CPC .... H01L 21/7684 (2013.01); H01L 21/76895 (2013.01); H01L 23/535 (2013.01)

(56) References Cited

U.S. PATENT DOCUMENTS

2018/0002571 A1* 1/2018 Stender ............... H01L 21/3212
2019/0031919 A1* 1/2019 Takeda .................... C08K 3/36
2020/0123413 A1* 4/2020 Ishibashi ........... H01L 21/30625

OTHER PUBLICATIONS

Wikipedia, "Starch" via https://web.archive.org/web/20180223050649/https://en.wikipedia.org/wiki/Starch ; pp. 1-13 (Year: 2018).*
Science ABC, "Why Does Water Evaporate at Room Temperature?" via https://web.archive.org/web/20211006003743/https://www.scienceabc.com/nature/why-does-water-evaporate-even-at-room-temperature.html ; pp. 1-13 (Year: 2021).*
4-H Learning Network, "What is water evaporation" via https://4hlnet.extension.org/what-is-water-evaporation/ ; pp. 1-3 (Year: 2019).*

* cited by examiner

SLURRY COMPOSITION AND METHOD FOR POLISHING AND INTEGRATED CIRCUIT

PRIORITY CLAIM AND CROSS-REFERENCE

This application claims priority of U.S. provisional application Ser. No. 63/031,505 filed on May 28, 2020, which is incorporated by reference in its entirety.

BACKGROUND

Polishing such as chemical mechanical polishing (CMP) has been widely used in semiconductor integrated circuit (IC) fabrication. The slurry for polishing one particular material in an integrated circuit, however, may result in corrosion of another material in the integrated circuit.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
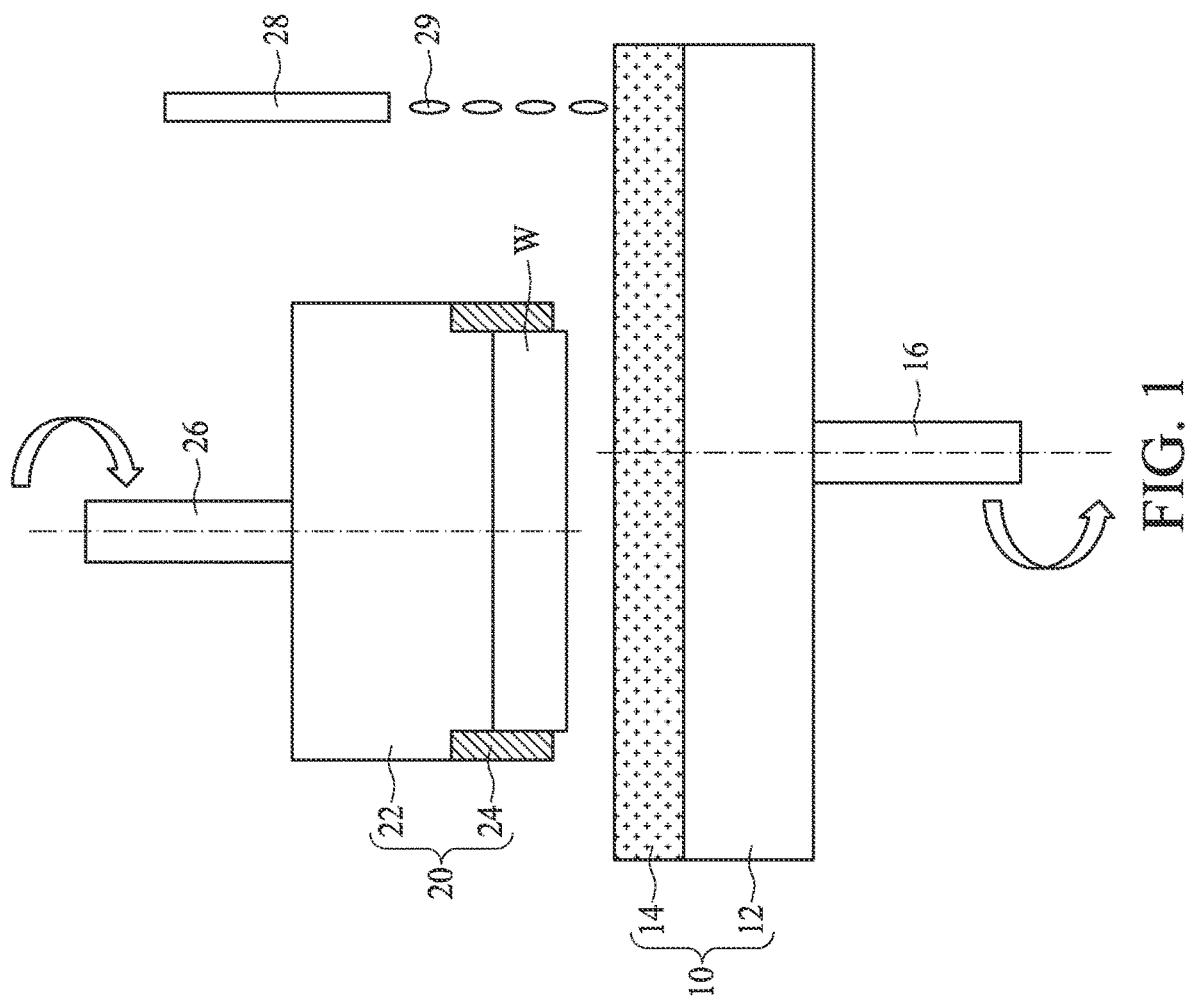
FIG. 1 is a schematic diagram of a CMP apparatus according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

Chemical mechanical polishing (CMP) is an operation of smoothing surfaces with the combination of chemical and mechanical forces. The CMP can be treated as a hybrid of chemical etching and abrasive polishing. The CMP operation uses a slurry including abrasives and corrosive chemicals in conjunction with a polishing pad and retaining ring. The polishing pad and wafer are pressed together by a polishing head and held in place by a retaining ring. The polishing head may be rotated with different axes of rotation, which removes material and tends to smooth any irregular topography, making the wafer flat or planar. This flat or planar surface may facilitate formation of successive components.

FIG. 1 is a schematic diagram of a CMP apparatus according to some embodiments of the present disclosure. As depicted in FIG. 1, the CMP apparatus 1 includes a polishing wheel assembly 10 and a wafer carrier assembly 20. The polishing wheel assembly 10 includes a polishing platen 12 and a polishing pad 14. The polishing platen 12 is coupled to a spindle (or a shaft) 16. The spindle 16 is able to be rotated by any suitable motor or driving mechanism. The polishing pad 14 is attached on the polishing platen 12, and thus is able to be rotated along with the polishing platen 12. The wafer carrier assembly 20 includes a wafer carrier 22 configured to hold or to grip a wafer W. The wafer carrier 22 is coupled to another spindle (or a shaft) 26. The spindle 26 is able to be rotated by any suitable motor or driving mechanism. The rotation of the wafer carrier 22 and the rotation of the polishing platen 12 are independently controlled. The rotational direction of the wafer carrier 22 or the rotational direction of the polishing platen 12 can be clockwise or counterclockwise. The wafer carrier 22 further includes a retainer ring 24 for retaining the wafer W to be polished. The retainer ring 24 is able to prevent the wafer W from sliding out from under the wafer carrier 22 as the wafer carrier 22 moves. In some embodiments, the retainer ring 24 has a ring-shaped structure.

During CMP operation, the polishing pad 14 coupled to the polishing platen 12 and the wafer W retained by the retainer ring 24 are both rotated at appropriate rates. Meanwhile, the spindle 26 supports a load, which is exerted against the wafer carrier 22, and thus is exerted against the wafer W, thereby contacting the polishing pad 14. Thus, the wafer W or the overlying film (not shown) over the wafer W is polished. During the CMP operation, a slurry introduction device 28 introduces slurry 29 on the polishing pad 14. The composition of slurry 29 may be selected depending on the material of the wafer W or the overlying film to be polished. For example, the types of the slurry 29 may be roughly classified into a slurry for oxide, a slurry for metal, and a slurry for poly-silicon according to the type of object to be polished. The composition of the slurry 29 may include abrasives to provide mechanical polishing force, and chemicals such as oxidizer to react with the material to be polished.

Figure 2A:
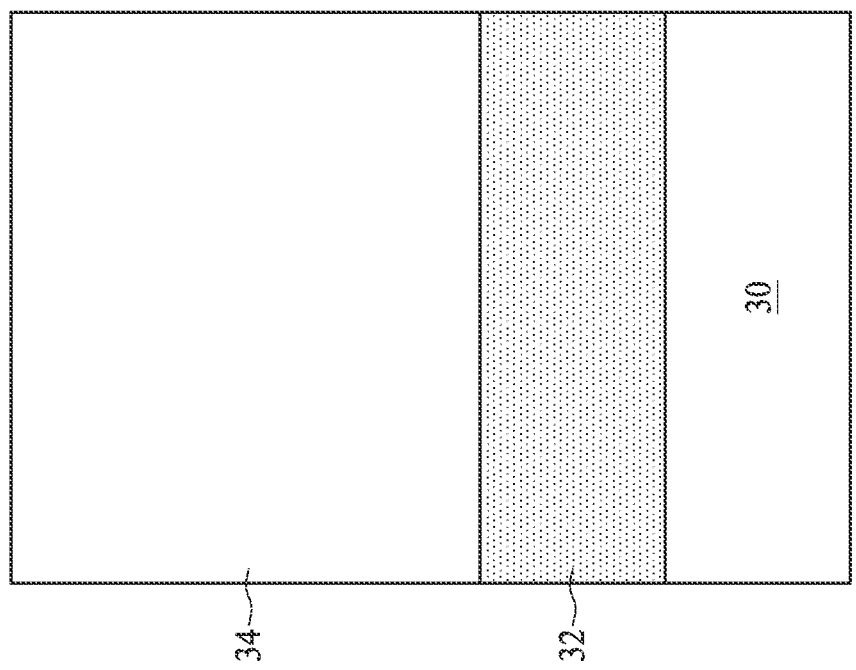
FIG. 2A, FIG. 2B and FIG. 2C are schematic diagrams illustrating a polishing method according to various aspects of a comparative embodiment of the present disclosure.
Figure 2B:
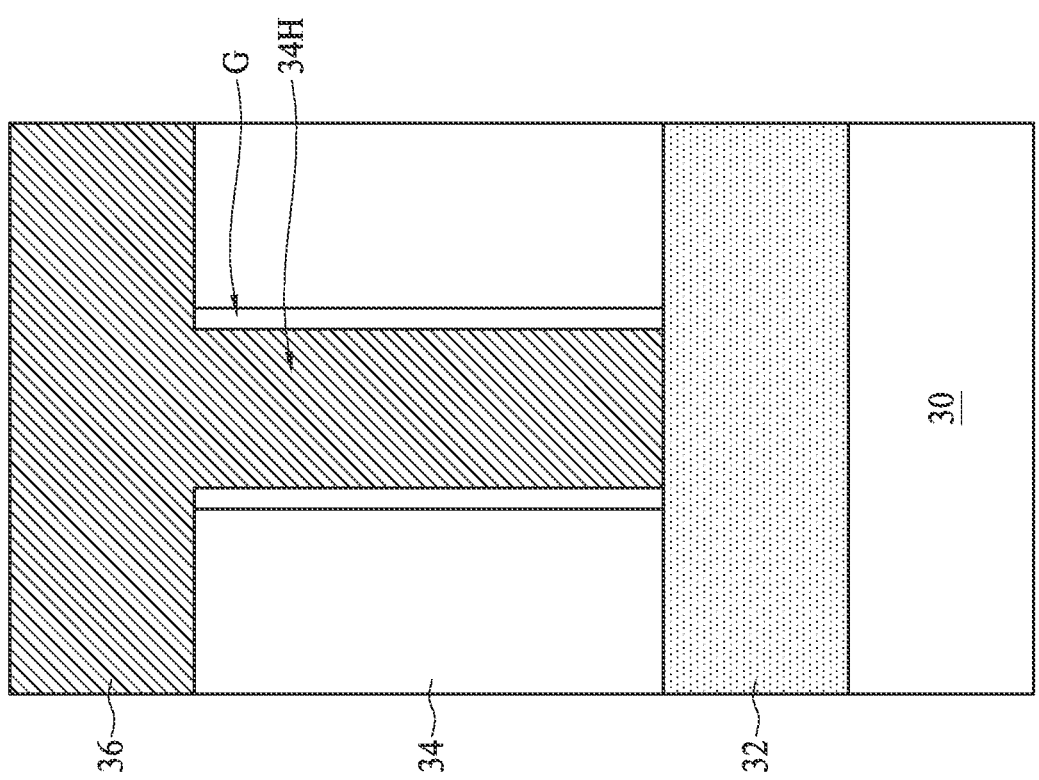
Figure 2C:
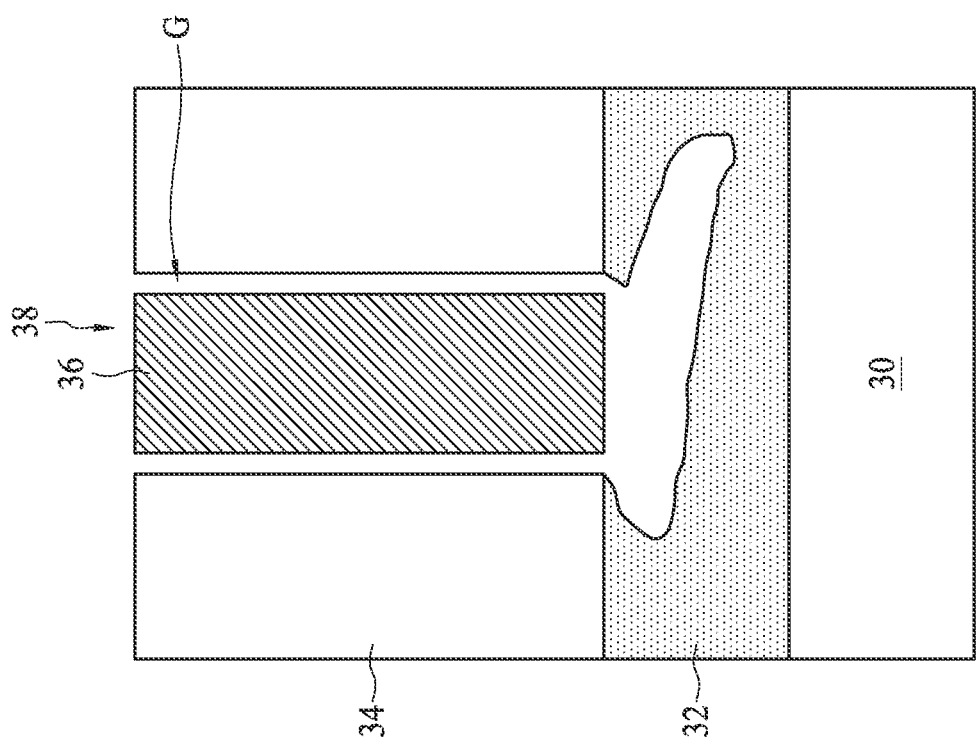

FIG. 2A, FIG. 2B and FIG. 2C are schematic diagrams illustrating a polishing method according to various aspects of a comparative embodiment of the present disclosure. As shown in FIG. 2A, a substrate 30 such as a semiconductor substrate is provided. A first conductive layer 32 is formed on the substrate 30. The material of the first conductive layer 32 may include, but is not limited to, metal such as cobalt (Co), copper (Cu) or an alloy thereof. A dielectric layer 34 is formed on the substrate 30, and covers the first conductive layer 32. The material of the dielectric layer 32 may include, but is not limited to, inorganic dielectric material such as silicon oxide, silicon nitride or silicon oxynitride, organic dielectric material or a combination thereof.

As shown in FIG. 2B, the dielectric layer 34 is patterned for example, by etching, to form a hole 34H partially exposing the first conductive layer 32. A second conductive layer 36 is formed on the dielectric layer 34 and in the hole 34H to electrically connected to the exposed first conductive layer 36. The material of the second conductive layer 36 may be different from or the same as the first conductive layer 32. By way of example, the material of the second conductive layer 36 may include, but is not limited to, metal such as tungsten (W) or an alloy thereof. In some embodiments, the interface between the dielectric layer 34 and the second conductive layer 36 may be porous, and thus forms a gap G between the dielectric layer 34 and the second conductive layer 36. For example, a tungsten-silicon oxide surface may be inherently porous, thereby forming a gap G automatically, which generates a liquid leakage path.

As shown in FIG. 2C, a CMP operation is performed to polish the second conductive layer 36 to form a conductive plug 38. Once the second conductive layer 36 over the dielectric layer 34 is removed, the gap G is exposed. The slurry used to polish the second conductive layer 36 may be filled in the gap G, and in contact with the underlying first conductive layer 32 during the CMP operation. The slurry for polishing the second conductive layer 36 may be reactive with the first conductive layer 32, and thus resulting in corrosion of the first conductive layer 32. As the substrate 30 is rotated during the CMP operation, fresh slurry may keep on entering the gap G to replace unfresh slurry and continuously corrodes the first conductive layer 32 through the gap G. Accordingly, the loss of the first conductive layer 32 may be serious during the CMP operation, which may adversely affect electric performance and reliability of the conductive plug 38.

In some embodiments of the present disclosure, a slurry composition for polishing is provided. The slurry composition includes a slurry and at least one rheology modifier dispensed in the slurry. The slurry may include a liquid carrier, abrasives and an oxidizer dispensed in the liquid carrier. The abrasives may be configured to provide mechanical polishing effect during the CMP operation. The abrasives may include inorganic particles such as silicon oxide particles, cerium oxide particles or the like. The liquid carrier may include water or other solvent. The oxidizer may be configured to oxidize the second conductive layer. The oxidized second conductive layer is softened, and is therefore easily removed by mechanical polishing force. The oxidizer may include, but is not limited to, a peroxide, a halogenoxy acid, a salt of halogenoxy acid, a persulfate, a perborate, a periodate or mixtures thereof.

In some embodiments, the slurry composition may further include a pH adjusting agent to adjust pH value of the slurry composition to accelerate the oxidization of the second conductive layer 36 to be polished. In some embodiments, the slurry composition may further include a corrosion inhibitor to inhibit corrosion of the second conductive layer 36 during the CMP operation.

The rheology modifier is configured to increase the viscosity of the slurry composition. The viscosity of the modified slurry is such selected that the CMP operation can be functionally operated and the slurry composition can be substantially kept in the gap G to alleviate corrosion. In some embodiments, the viscosity of the slurry composition is, but not limited to be, greater than about 1.1 mPa·S. By way of example, the viscosity of the slurry composition is between about 1.3 mPa·S and about 50 mPa·S. The rheology modifier may include, but is not limited to, a cellulose derivative, a polysaccharide derivative, an acrylic resin, or mixtures thereof. The cellulose derivative may include carboxymethylcellulose, hydroxyethylcellulose or a mixture thereof. The polysaccharide derivative may include locust bean gum, guar gum, xanthum gum or mixtures thereof. The acrylic resin may include polyacrylic acid, polyacrylamide or a mixture thereof. In some embodiments, the amount of the rheology modifier in the slurry composition is at least 20 ppm by weight. For example, the amount of the rheology modifier in the slurry composition is between about 100 ppm and about 1000 ppm by weight.

The rheology modifier is configured to increase the viscosity of the slurry composition such that the slurry composition is less flowable in the gap G during the CMP operation. The high viscosity characteristic makes the slurry composition tend to stay in the gap G, and blocks the underlying first conductive layer 32 from being exposed to fresh slurry. Accordingly, corrosion of the underlying first conductive layer 32 can be alleviated.

In some embodiments, the slurry composition may further include at least one viscosity improver. The viscosity improver may be interlocked with the rheology modifier in the slurry composition to further increase the viscosity of the slurry composition. By way of example, the viscosity improver may include at least one divalent ion, at least one trivalent ion or a mixture thereof.

Figure 3:
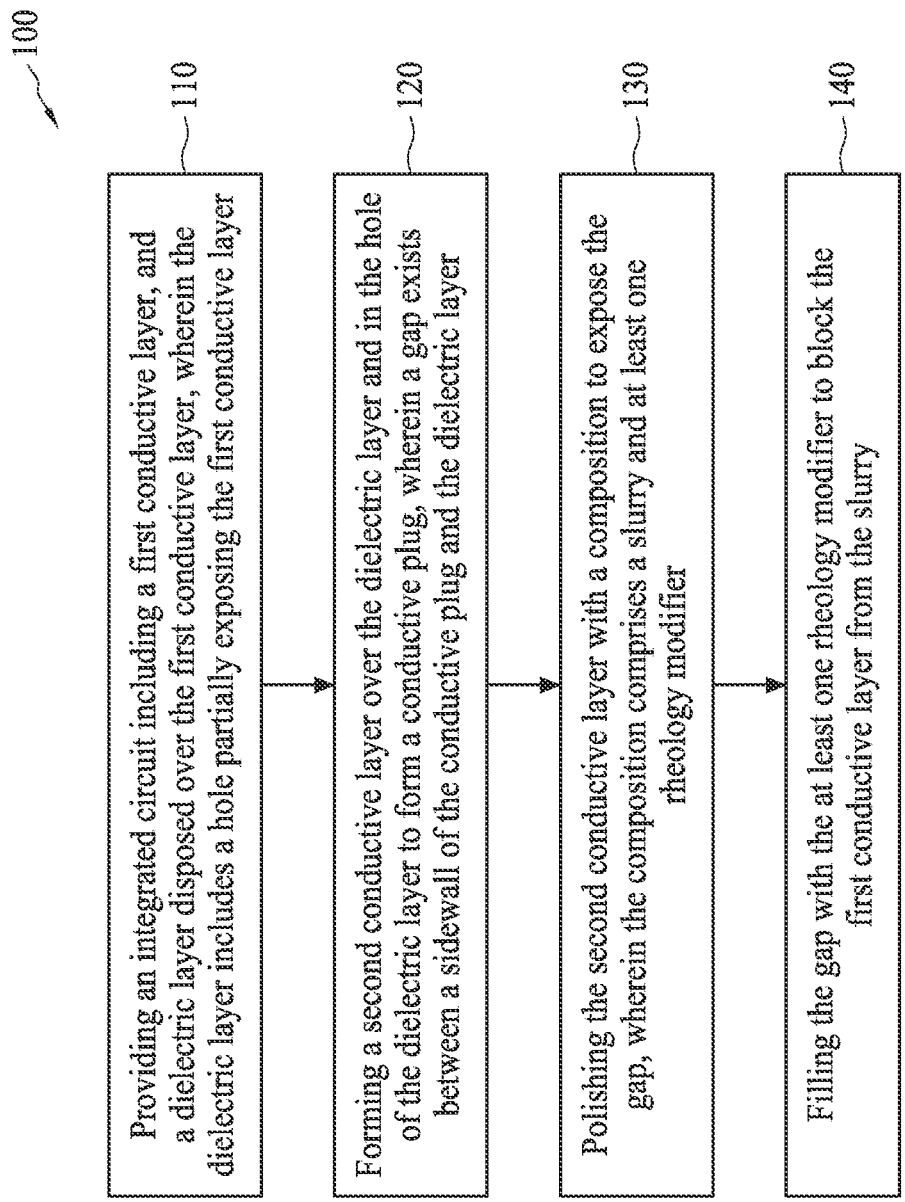
FIG. 3 is a flow chart illustrating a polishing method according to various aspects of one or more embodiments of the present disclosure.

Refer to FIG. 3. FIG. 3 is a flow chart illustrating a polishing method according to various aspects of one or more embodiments of the present disclosure. The method 100 begins with operation 110 in which an integrated circuit is provided. The integrated circuit includes a first conductive layer, and a dielectric layer disposed over the first conductive layer. The dielectric layer includes a hole partially exposing the first conductive layer. The method 100 proceeds with operation 120 in which a second conductive layer is formed over the dielectric layer and in the hole of the dielectric layer to form a conductive plug, where a gap exists between a sidewall of the conductive plug and the dielectric layer. The method 100 proceeds with operation 130 in which the second conductive layer is polished with a slurry composition to expose the gap, where the slurry composition comprises a slurry and at least one rheology modifier. The method 100 proceeds with operation 140 in which the gap is filled with the at least one rheology modifier to block the first conductive layer from the slurry.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 4A:
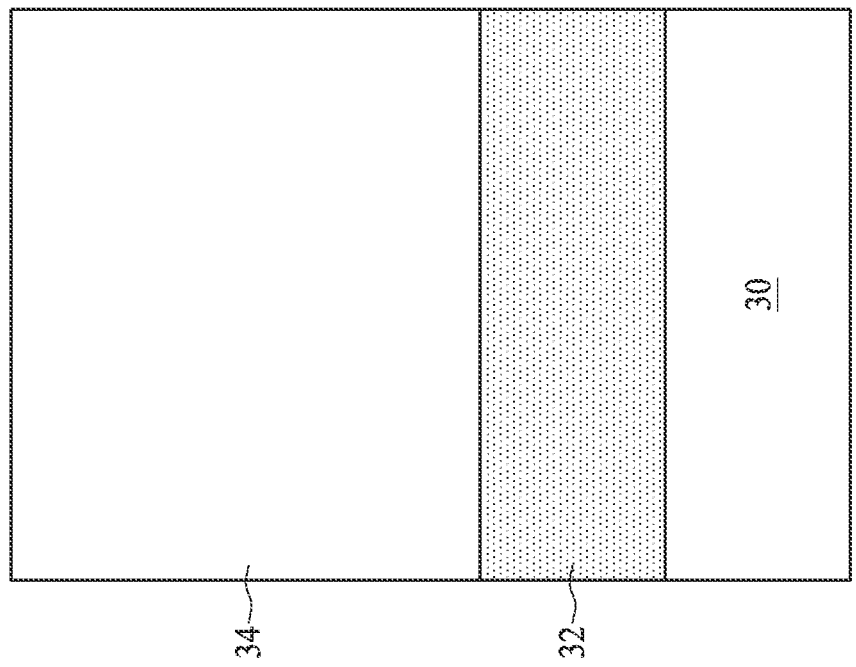
FIG. 4A, FIG. 4B and FIG. 4C are schematic diagrams illustrating a polishing method according to various aspects of some embodiments of the present disclosure.
Figure 4B:
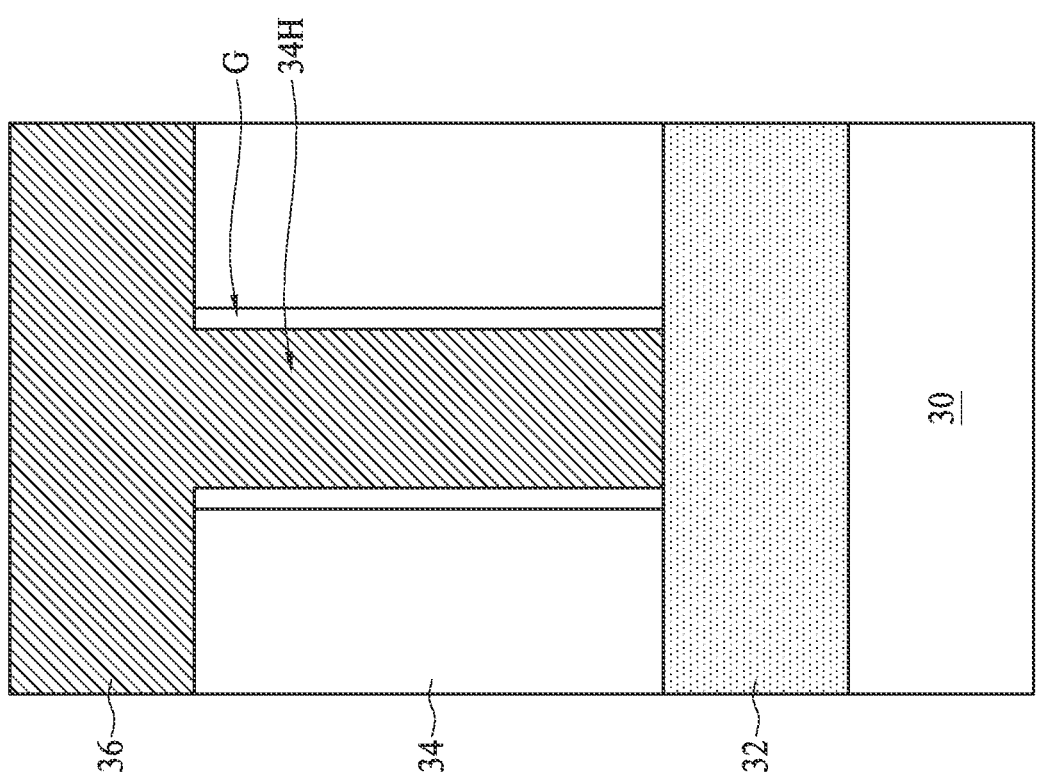
Figure 4C:
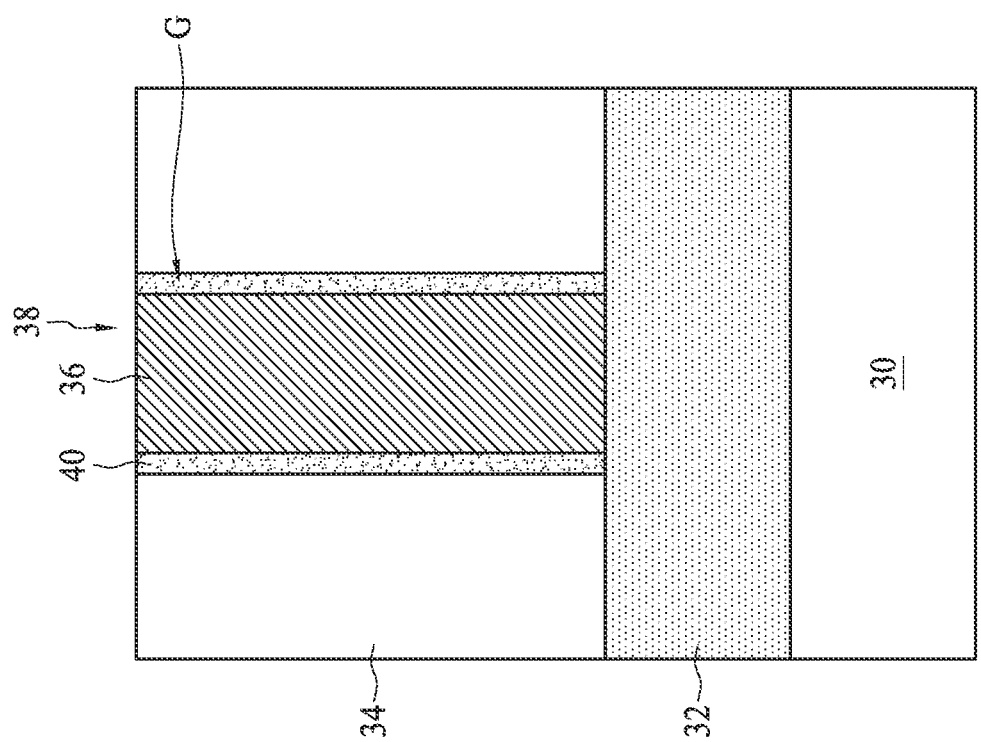

FIG. 4A, FIG. 4B and FIG. 4C are schematic diagrams illustrating a polishing method according to various aspects of some embodiments of the present disclosure. As shown in FIG. 4A, a substrate 30 such as a semiconductor substrate is provided. A first conductive layer 32 is formed on the substrate 30. The material of the first conductive layer 32 may include, but is not limited to, metal such as cobalt (Co) or an alloy thereof. A dielectric layer 34 is formed on the substrate 30, and covers the first conductive layer 32. The material of the dielectric layer 32 may include, but is not limited to, inorganic dielectric material such as silicon oxide, silicon nitride or silicon oxynitride, organic dielectric material or a combination thereof. In some embodiments, the dielectric layer 32 may include a tetraethylorthosilicate (TEOS) oxide layer formed by deposition using TEOS as deposition precursors.

As shown in FIG. 4B, the dielectric layer 34 is patterned for example, by etching, to form a hole 34H partially exposing the first conductive layer 32. In some embodiments, the width or diameter of the hole 34H is, but not limited to be, ranging from about 14 angstroms to about 20 angstroms. In some embodiments, the depth of the hole 34H is, but not limited to be, ranging from about 10 angstroms to about 90 angstroms. The cross-sectional profile of the hole 34H may include a rectangular profile, a trapezoid shape, an inversed trapezoid shape or other geometrical shape. A second conductive layer 36 is formed on the dielectric layer 34 and in the hole 34H to electrically connected to the exposed first conductive layer 36. The material of the second conductive layer 36 may be different from or the same as the first conductive layer 32. By way of example, the material of the second conductive layer 36 may include, but is not limited to, metal such as tungsten (W) or an alloy thereof. In some embodiments, the interface between the dielectric layer 34 and the second conductive layer 36 may be porous, and thus forms a gap G between the dielectric layer 34 and the second conductive layer 36. For example, a tungsten-silicon oxide surface may be inherently porous, thereby forming a gap G automatically, which generates a liquid leakage path. In some embodiments, the width of the gap G is, but not limited to be, ranging from about 1 angstrom to about 10 angstroms.

As shown in FIG. 4C, a CMP operation is performed to polish the second conductive layer 36 to form a conductive plug 38. Once the second conductive layer 36 over the dielectric layer 34 is removed, the gap G is exposed. The slurry composition used to polish the second conductive layer 36 may be filled in the gap G. The rheology modifier in the slurry composition increases the viscosity of the slurry composition, thereby changing the rheological behavior of the slurry composition during the CMP operation. The high viscous slurry composition tends to remain in the gap G, and blocks the liquid leakage path to the first conductive layer 32 during the CMP operation. As the substrate 30 is rotated during the CMP operation, fresh slurry is blocked from entering the gap G. Accordingly, the corrosion of the first conductive layer 32 is alleviated. In some embodiments, liquid component such as the liquid carrier may be vaporized successively, and other components of the slurry composition may remain in the gap G, forming a block layer 40. In some embodiments, the width of the gap G is narrower than the dimension of the abrasives, and thus the abrasives may not enter the gap G.

Figure 5A:
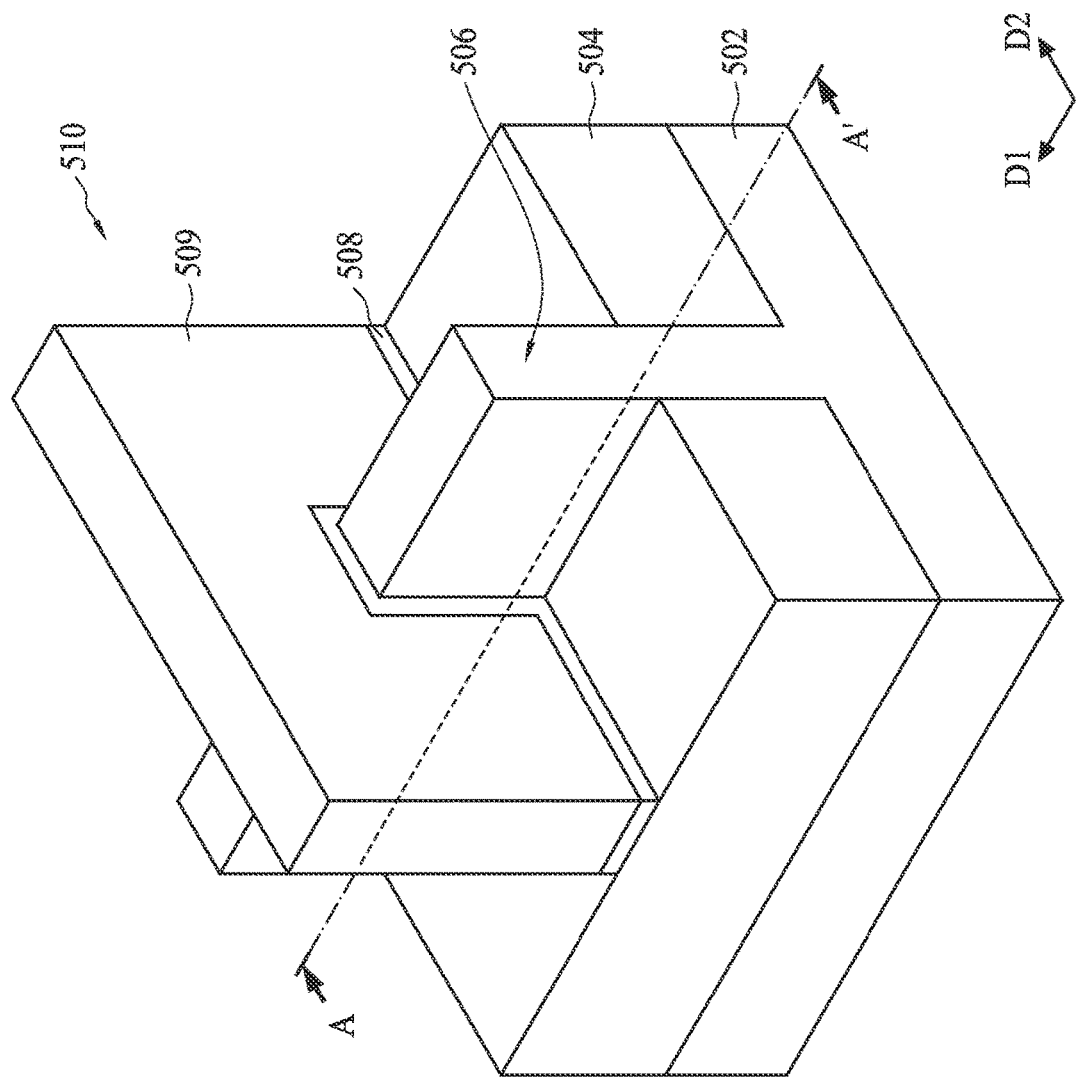
FIG. 5A, FIG. 5B, FIG. 5C, FIG. 5D, FIG. 5E, FIG. 5F, FIG. 5G, FIG. 5H, FIG. 5I, FIG. 5J and FIG. 5K are schematic diagrams illustrating a method of manufacturing an integrated circuit according to some embodiments of the present disclosure.
Figure 5B:
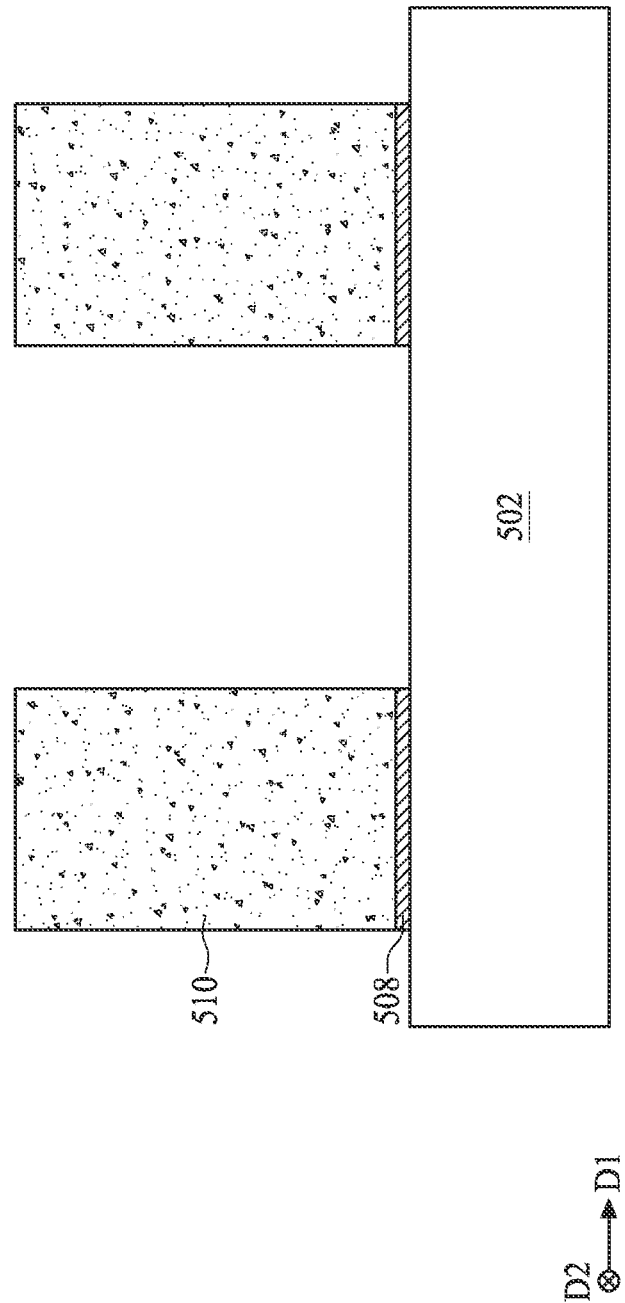

FIG. 5A, FIG. 5B, FIG. 5C, FIG. 5D, FIG. 5E, FIG. 5F, FIG. 5G, FIG. 5H, FIG. 5I, FIG. 5J and FIG. 5K are schematic diagrams illustrating a method of manufacturing an integrated circuit according to some embodiments of the present disclosure. FIG. 5A is a schematic perspective view of an integrated circuit, and FIG. 5B, FIG. 5C, FIG. 5D, FIG. 5E, FIG. 5F. FIG. 5G, FIG. 5H, FIG. 5I, FIG. 5J and FIG. 5K are cross-sectional views illustrating the integrated circuit at different fabrication stages taken along a line A-A' of FIG. 5A. In some embodiments, the integrated circuit may include field effect transistor (FET), metal gate transistor, interconnections, or other semiconductor structures. As shown in FIG. 5A and FIG. 5B, a substrate 502 is received. The substrate 502 may be a semiconductor wafer such as a silicon wafer. Alternatively or additionally, the substrate 502 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlInAs, AlGaAs, GaInAs, GaInP, and/or GaInAsP.

The substrate 502 may include various doping configurations depending on design requirements as is known in the art. For example, different doping profiles (e.g., n wells, p wells)) may be formed on the substrate 502 in regions designed for different device types (e.g., n-type field effect transistors (NFET), p-type field effect transistors (PFET)). The suitable doping may include ion implantation of dopants and/or diffusion processes. Isolation structures (e.g., shallow trench isolation (STI) structures) 504 may be formed on the substrate 502. In some embodiments, the substrate 502 may include fin structures 506 electrically isolated from each other by the isolation structures 504. In some embodiments, the fin structure 506 extends along a first direction D1.

In some embodiments, a dielectric layer 508 is formed to cover the isolation structure 504 and the fin structure 506. In some embodiments, the dielectric layer 508 may include an organic dielectric material such as silicon oxide, but the disclosure is not limited thereto. A thickness of the dielectric layer 508 can be between approximately 20 angstroms and approximately 50 angstroms, but the disclosure is not limited thereto.

A semiconductor layer 509 is formed over the substrate 502. In some embodiments, the semiconductor layer 509 is made of polysilicon, but the disclosure is not limited thereto. The semiconductor layer 509 and the dielectric layer 508 are patterned to form a sacrificial gate layer 510. The sacrificial gate layer 510 extends along a second direction D2 different from the first direction D1. The first direction D1 and the second direction D2 may be in the same horizontal plane. The sacrificial gate layer 510 covers a portion of the fin structure 506 as shown in FIGS. 5A and 5B. The sacrificial gate layer 510 is at least partially disposed over the fin structure 506, and the portion of the fin structure 506 underlying the sacrificial gate layer 510 may be referred to as the channel region. The sacrificial gate layer 510 may also define a source/drain region of the fin structure 506, for example, as portions of the fin structure 506 adjacent to and on opposing sides of the channel region. A portion of the dielectric layer 508 is exposed through the sacrificial gate layer 510 after the forming of the sacrificial gate layer 510. In some embodiments, the sacrificial gate layer 510 may be protected by a patterned hard mask.

Figure 5C:
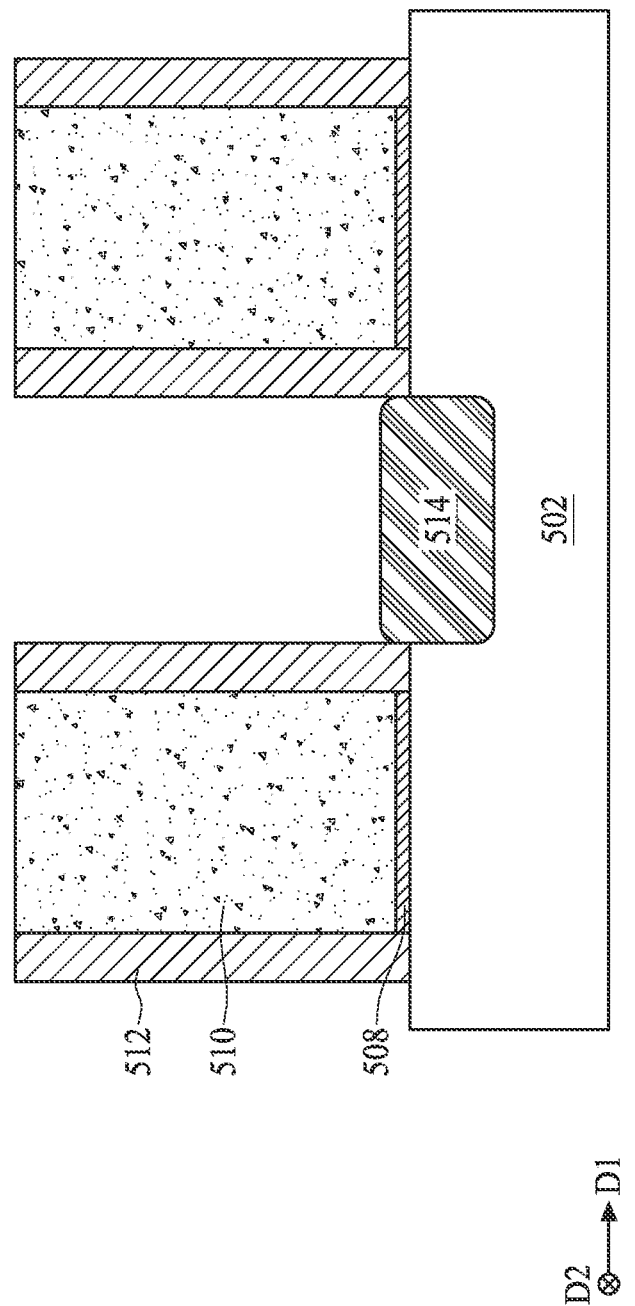

Referring to FIGS. 5C, spacers 512 are formed over sidewalls of the sacrificial gate layer 510. In some embodiments, the material of the spacers 512 may include, but is not limited to, silicon nitride, silicon carbide, silicon oxide, silicon oxynitride or any suitable material. In some embodiments, the spacers 512 are formed by deposition and etching back operations. Subsequently, the fin structure 506 at two sides of the sacrificial gate layer 510 may be recessed. In some embodiments, a strained source/drain (S/D) structure 514 is formed at two sides of the sacrificial gate layer 510. In some embodiments, the strained S/D structures 514 are formed by growing a strained material by an epitaxial (epi) operation. In some embodiments, a lattice constant of the strained material may be different from a lattice constant of the substrate 502 and the fin structure 506. In some embodiments, the strained S/D structures 514 may include Ge, SiGe, InAs, InGaAs, InSb, GaSb, InAlP, InP, or a combination thereof, but the disclosure is not limited thereto.

Figure 5D:
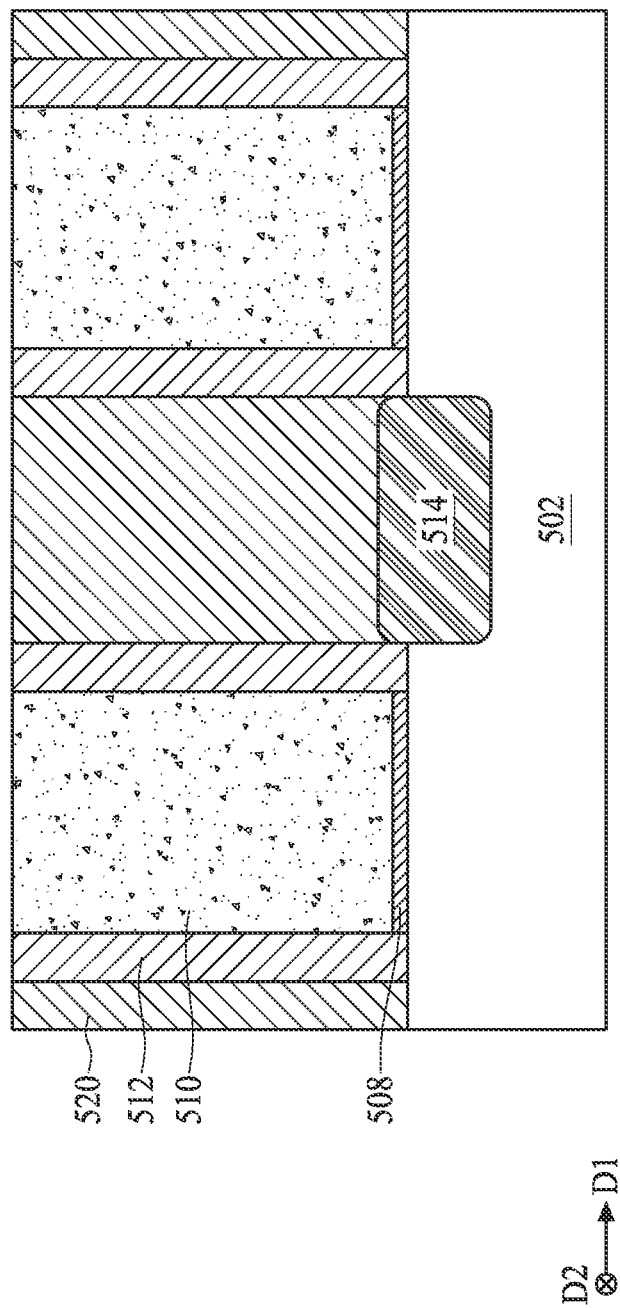

Referring to FIG. 5D, a dielectric structure 520 is formed over the substrate 502. In some embodiments, the dielectric structure 520 can include an etch-stop layer (e.g., a contact etch stop layer (CESL)) (not shown) and various dielectric layers (e.g., an inter-layer dielectric (ILD) layer) formed over the substrate 502 after the forming of the strained S/D structures 514. In some embodiments, the CESL includes a SiN layer, a SiCN layer, a SiON layer, and/or other materials known in the art. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the CESL and the ILD layer are deposited, a planarization process, such as a chemical mechanical planarization (CMP) operation, may be performed to form the dielectric structure 520. Consequently, the dielectric structure 520 surrounds the sacrificial gate layer 510 and the fin structure 506. In other words, the fin structure 506 and the sacrificial gate layer 510 are embedded in the dielectric structure 520, while a top surface of the sacrificial gate layer 510 remains exposed. In some embodiments, the sacrificial gate layer 510 can be replaced with the metal gate structure, but the disclosure is not limited thereto.

Figure 5E:
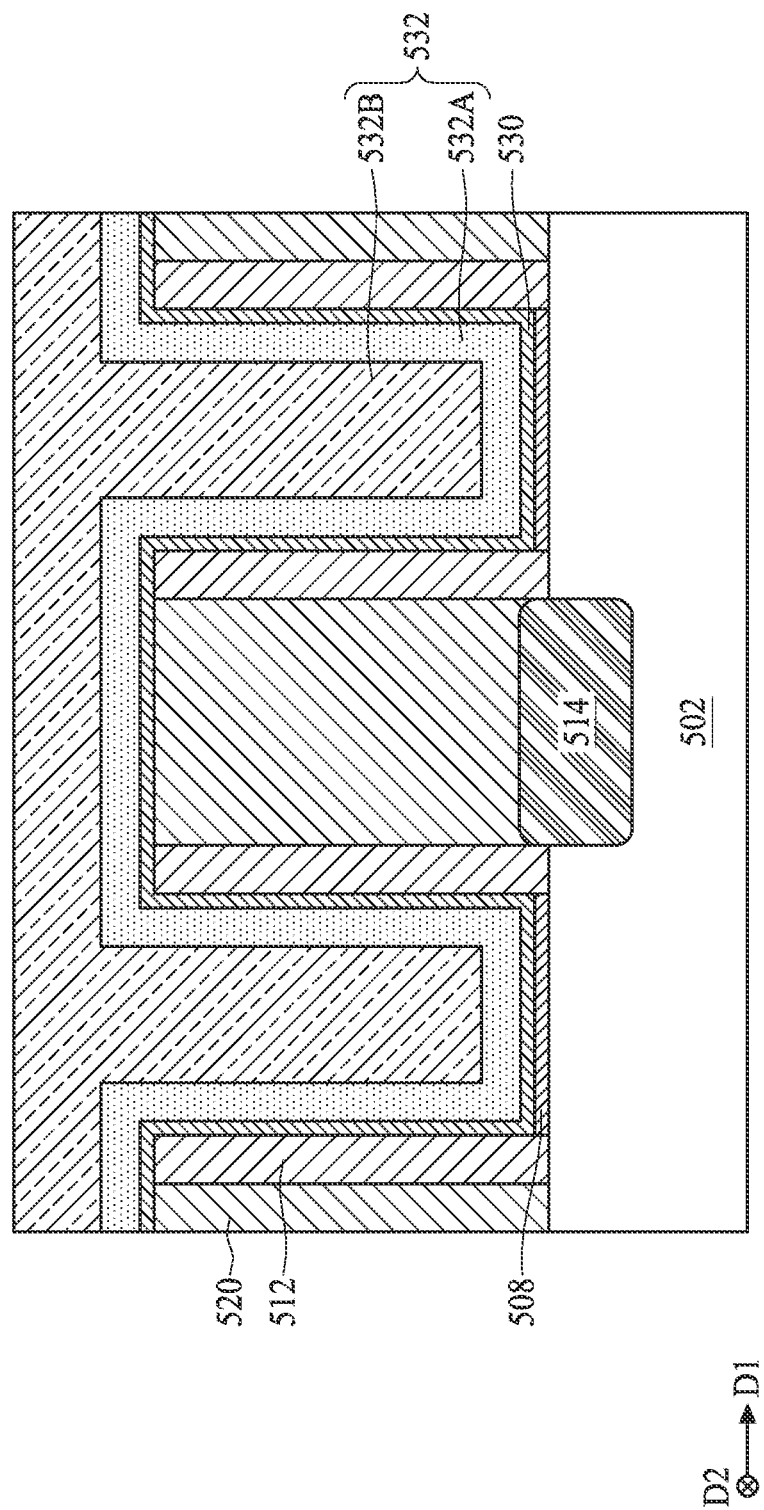

Referring to FIG. 5E, the sacrificial gate layer 510 is removed. In some embodiments, a dry etching operation is performed to remove the sacrificial gate layer 510. As shown in FIG. 5E, the gate dielectric layer 530 and the metal gate electrode 532 are formed over the dielectric layer 508. In some embodiments, the gate dielectric layer 530 includes a high-k dielectric material having a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfO_xN_y$), other suitable metal-oxides, or combinations thereof. In some embodiments, the metal gate electrode 532 may include at least a barrier metal layer (not shown), a work functional metal layer 532A and a gap-filling metal layer 532B. The barrier metal layer can include, for example but not limited to, TiN. The work function metal layer 532A can include a single layer of TiN, TaN, TaAlC, TiC, TaC, Co, Al, TiAl, HfTi, TiSi, TaSi or TiAlC, or a multilayer of two or more of these materials, but is not limited to this. For the n-channel FET, one or more of TaN, TaAlC, TiN, TiC, Co, TiAl, HfTi, TiSi and TaSi is used as the work function metal layer 532A, and for the p-channel FET, one or more of TiAlC, Al, TiAl, TaN, TaAlC, TiN, TiC and Co is used as the work function metal layer 532A. In some embodiments, the gap-filling metal layer 532B can include conductive material such as Al, Cu, AlCu, or W, but is not limited to the above-mentioned materials.

Figure 5F:
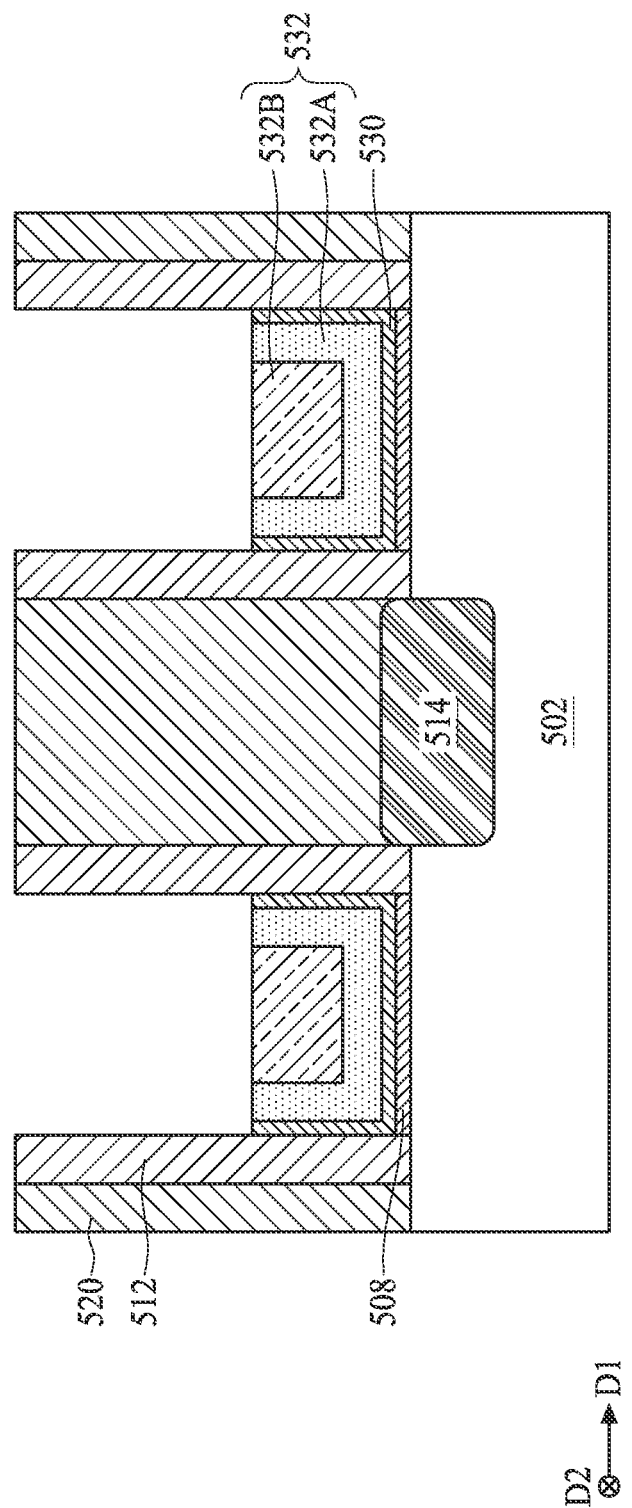

Referring to FIG. 5F, the gate dielectric layer 530 and the metal gate electrode 532 on the dielectric structure 520 can be removed by CMP, for example. Subsequently, the metal gate electrode 532 and the gate dielectric layer 530 can be recessed by etching for example, while a portion of the metal gate electrode 532 and the gate dielectric layer 530 remains between the spacers 512.

Figure 5G:
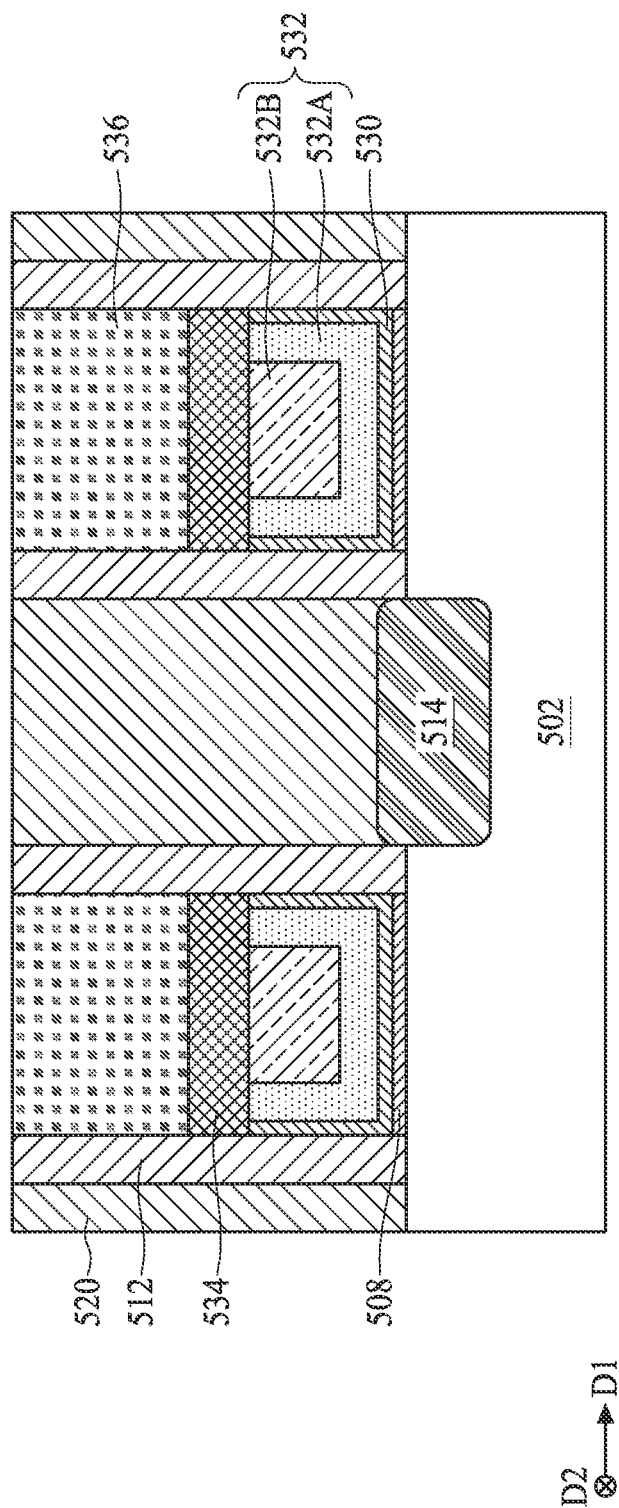

Referring to FIG. 5G, a cap layer 534 may be formed on the remaining metal gate electrode 532 and the gate dielectric layer 530 between the spacers 512. The cap layer 534 may include a dielectric material such as silicon oxide, silicon nitride or the like. A dielectric layer 536 can be formed on the cap layer 534 between the spacers 512. The dielectric layer 536 may include dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 536 can be deposited, and a planarization operation, such as a chemical mechanical planarization (CMP) operation may be performed to remove the dielectric layer 536 on the dielectric structure 520.

Figure 5H:
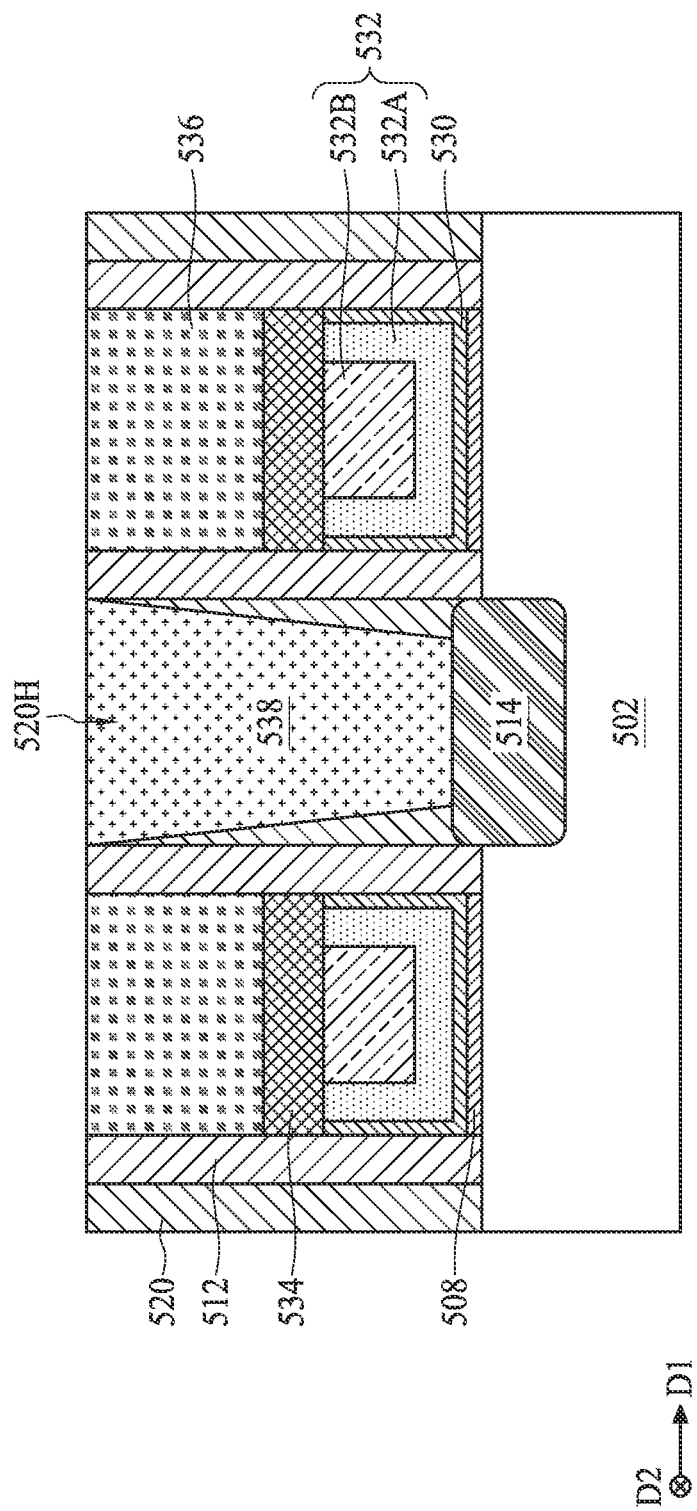

Referring to FIG. 5H, one or more holes 520H can be formed in the dielectric structure 520 to expose the strained S/D structures 514. The hole 520H can be formed by using a lithographic operation with masking technologies and anisotropic etch operation, but the disclosure is not limited thereto. Subsequently, a conductive layer, such as a cobalt layer, in some embodiments, a liner, a barrier, a seed layer or any intervening layer can be formed between the conductive layer and the dielectric structure 520. In some other embodiments, the conductive layer and the dielectric structure 520 may include a barrier-less interface, i.e., the conductive layer can be formed in an absence of a liner, a barrier, a seed layer or any intervening layer. Therefore in such embodiments, the conductive layer can be in contact with the dielectric structure 520, but the disclosure is not limited thereto. Then, a planarization operation such as a chemical mechanical planarization (CMP) operation may be performed to remove the conductive layer on the dielectric structure 520 to form a conductive layer 538 electrically connected to the strained S/D structures 514.

Figure 5I:
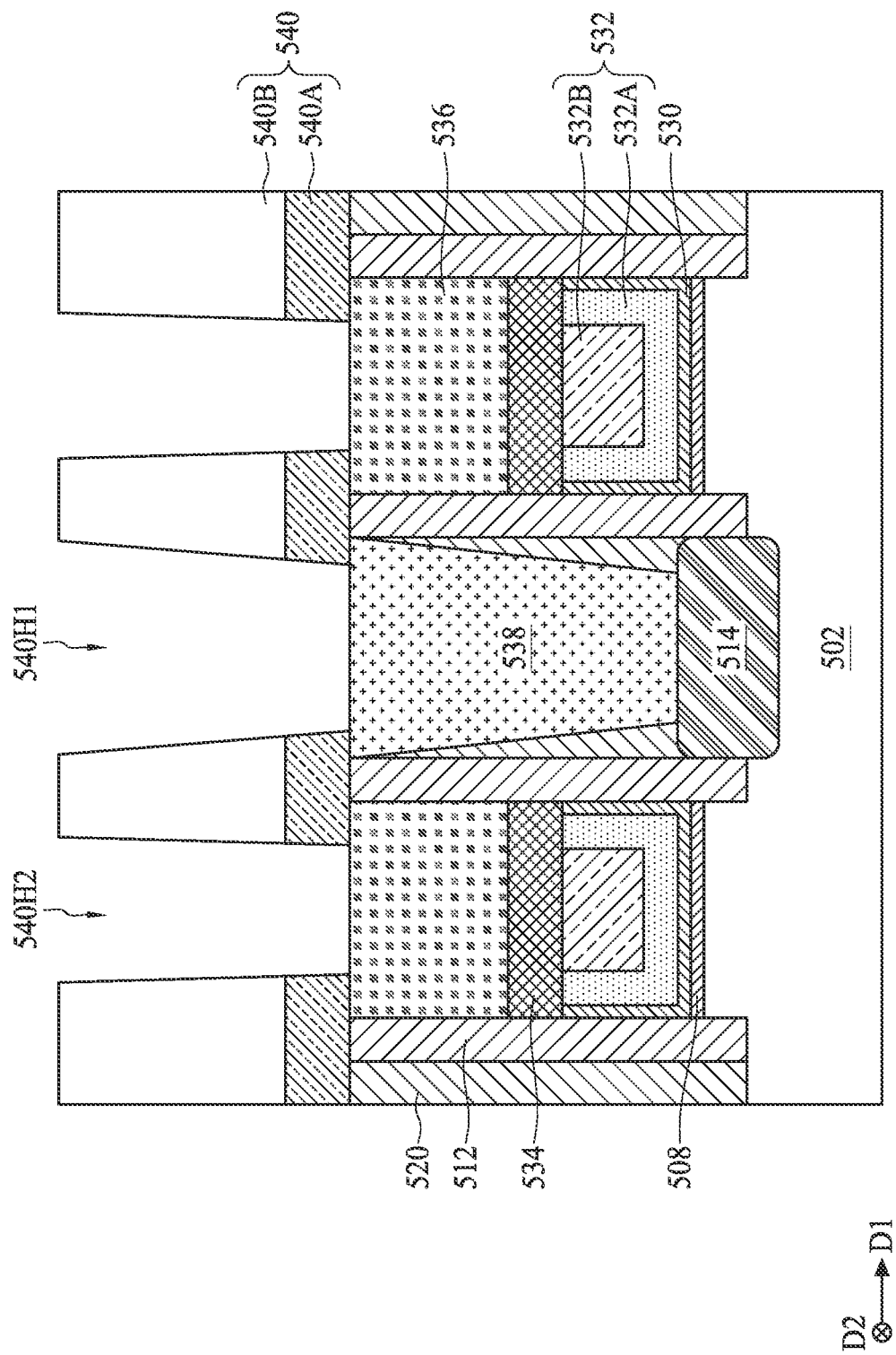

Referring to FIG. 5I, another dielectric layer 540 is formed on the dielectric structure 520. In some embodiments, the dielectric layer 540 may be a multi-layered dielectric layer including a first dielectric film 540A and a second dielectric film 540B. The dielectric layer 540 and the second dielectric film 540B each may include a dielectric material such as silicon nitride, silicon oxynitride, tetraethylorthosilicate (TEOS) oxide, un-doped silicate glass, or doped silicon oxide such as borophosphosilicate glass (BPSG), fused silica glass (FSG), pliosphosilicate glass (PSG), boron doped silicon glass (BSG), and/or other suitable dielectric materials or the like. The dielectric layer 540 is then patterned to form a plurality of holes 540H1. The holes 540H1 expose at least a portion of the conductive layer 538.

Figure 5J:
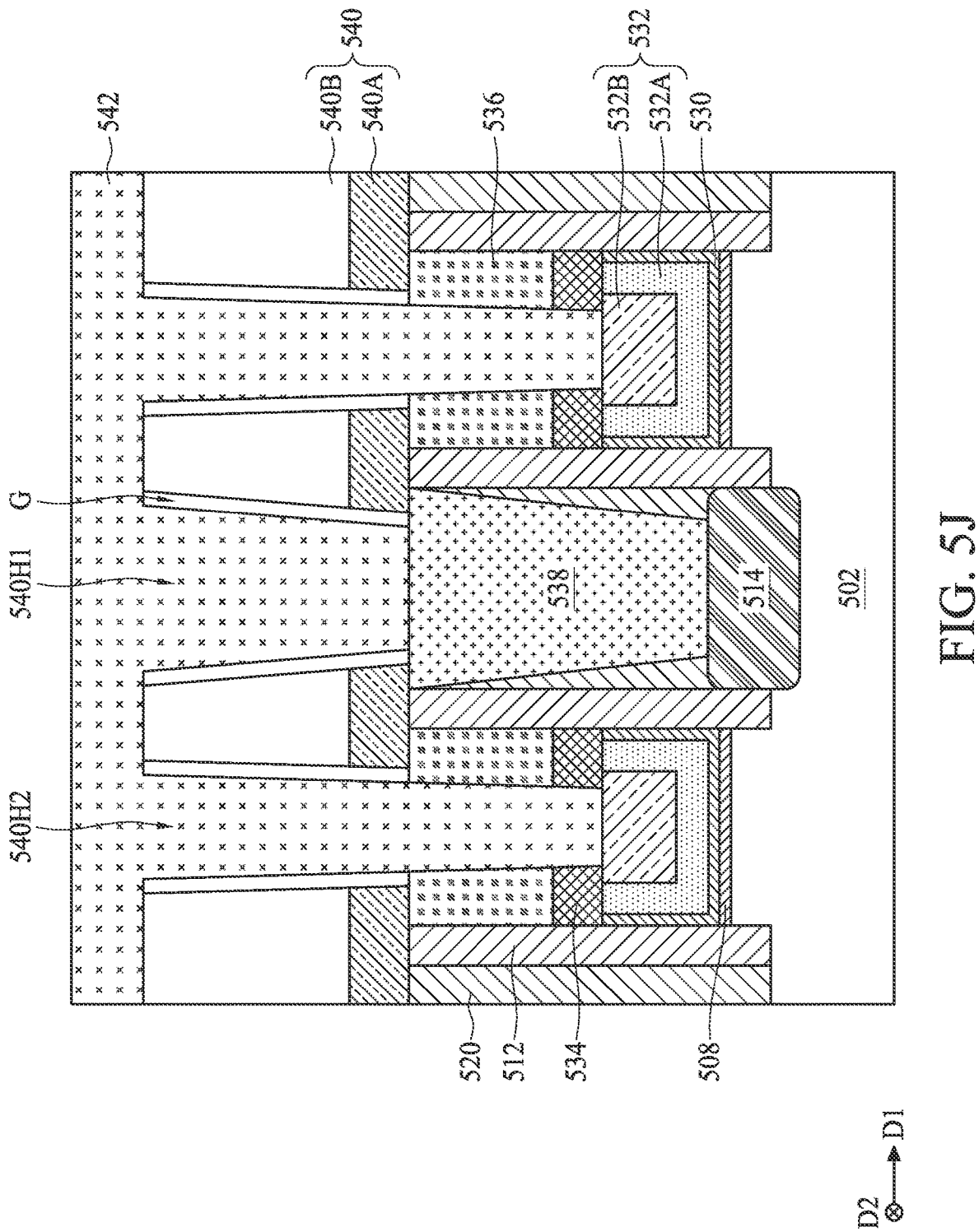

Referring to FIG. 5J, another conductive layer 542 is formed over the dielectric layer 540 and in the hole 540H1 of the dielectric layer 540. The material of the conductive layer 542 may be different from the conductive layer 538. By way of example, the material of the conductive layer 542 may include, but is not limited to, tungsten (W) or an alloy thereof, and the material of the conductive layer 538 may include, but is not limited to, cobalt (W) or an alloy thereof. In some embodiments, the width or diameter of the hole 540H1 is, but not limited to be, ranging from about 14 angstroms to about 20 angstroms. In some embodiments, the depth of the hole 540H1 but not limited to be, ranging from about 10 angstroms to about 90 angstroms. In some other embodiments, the conductive layer 542 and the dielectric layer 540 may include a barrier-less interface, i.e., the conductive layer 542 can be formed in an absence of a liner, a barrier, a seed layer or any intervening layer. The interface between the dielectric layer 540 and the conductive layer 542 may be porous, and thus forms a gap G between the dielectric layer 540 and the conductive layer 542. For example, a tungsten-silicon oxide surface may be inherently porous, thereby forming a gap G and generating a liquid leakage path. In some embodiments, the width of the gap G is, but not limited to be, ranging from about 1 angstrom to about 10 angstroms.

Figure 5K:
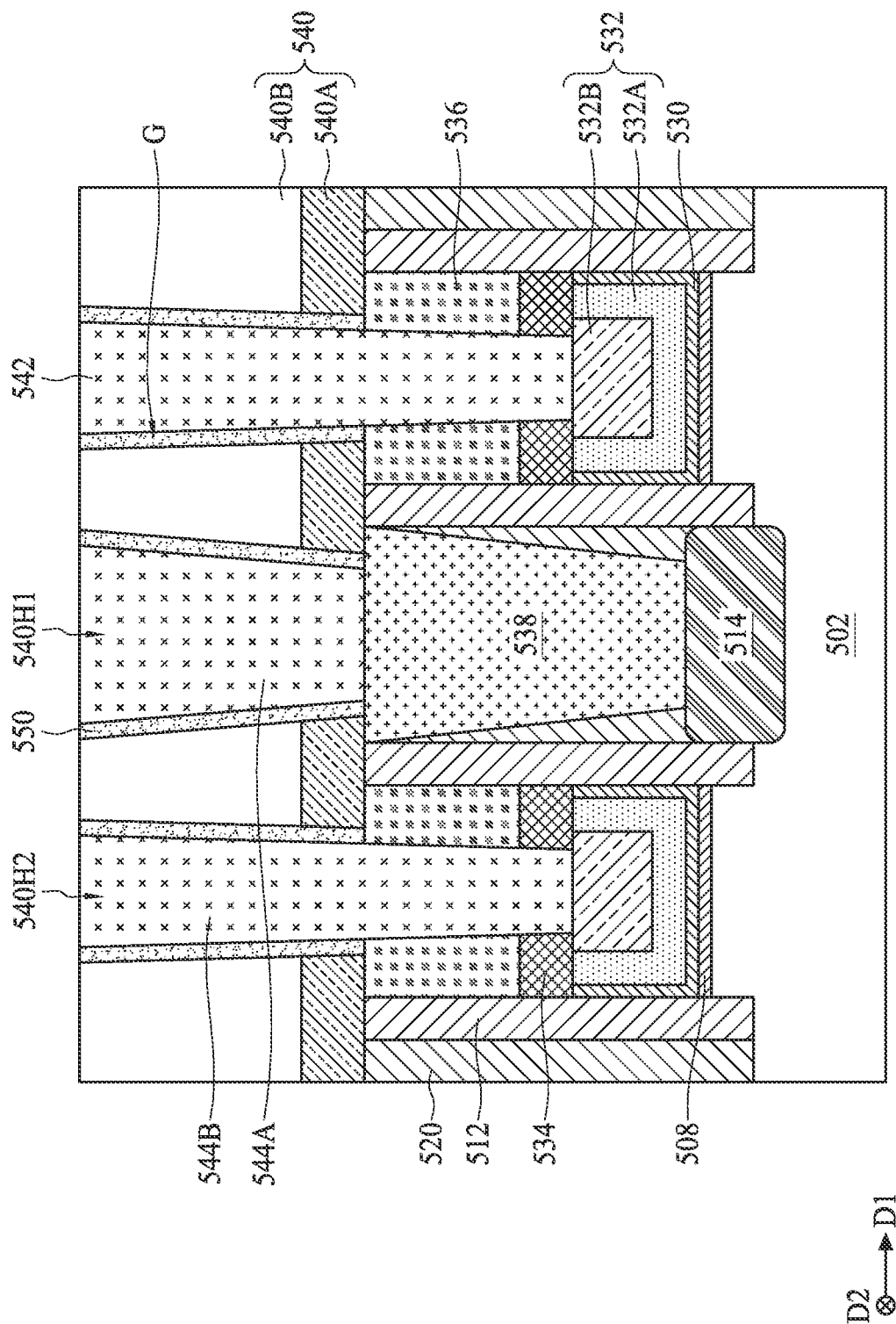

As shown in FIG. 5K, a CMP operation is performed to polish the conductive layer 542 to form a conductive plug 544A. The cross-sectional profile of the conductive plug 544A may include a rectangular profile, a trapezoid shape, an inversed trapezoid shape or other geometrical shape. When the conductive layer 542 over the dielectric layer 540 is removed, the gap G is exposed. The slurry composition used to polish the conductive layer 542 may be filled in the gap G. The rheology modifier in the slurry composition increases the viscosity of the slurry composition, thereby changing the rheological behavior of the slurry composition during the CMP operation. The high viscous slurry composition tends to remain in the gap G, and blocks the liquid leakage path to the conductive layer 538 during the CMP operation. As the substrate 502 is rotated during the CMP operation, fresh slurry is blocked from entering the gap G. Accordingly, the corrosion of the conductive layer 538 is inhibited. In some embodiments, liquid component such as the liquid carrier may be vaporized successively, and other components of the slurry composition may remain in the gap G, forming a block layer 550. Back end operations can be continued to form interconnection layers to manufacturing the integrated circuit.

In some embodiments, the dielectric layer 540, the dielectric layer 536 and the cap layer 534 may further be patterned to form a plurality of holes 540H2 exposing the metal gate electrode 532, and the conductive layer 542 may be further formed in the holes 540H1 to form a conductive plug 544B electrically connecting the metal gate electrode 532. In some embodiments, the gap G may further exist between the conductive plug 544B and the dielectric layer 540, and the block layer 550 may be formed in the gap G may further exist between the conductive plug 544B and the dielectric layer 540. In some other embodiments, the gap G may further exist between the conductive plug 544B and the dielectric layer 536 and between the conductive plug 544B and the cap layer 534, and the block layer 550 may be formed in the gap G may further exist between the conductive plug 544B and the dielectric layer 536 and between the conductive plug 544B and the cap layer 534.

In the present disclosure, a slurry composition including a rheology modifier is provided. The rheology modifier increases the viscosity of the slurry composition, and render the slurry composition remain in a liquid leakage path during CMP operation. Accordingly, corrosion of underlying layer due to exposure to the slurry composition can be mitigated.

In some embodiments, a slurry composition for polishing includes a slurry and at least one rheology modifier. The slurry includes at least one liquid carrier, at least one abrasives and at least one oxidizer. The rheology modifier is dispensed in the slurry.

In some embodiments, a polishing method includes following operations. An integrated circuit is provided. The integrated circuit includes a first conductive layer, and a dielectric layer disposed over the first conductive layer. The dielectric layer includes a hole partially exposing the first conductive layer. A second conductive layer is formed over the dielectric layer and in the hole of the dielectric layer to form a conductive plug, where a gap exists between a sidewall of the conductive plug and the dielectric layer. The second conductive layer is polished with a slurry composition to expose the gap. The slurry composition includes a slurry and at least one rheology modifier. The gap is filled with the at least one rheology modifier to block the first conductive layer from the slurry.

In some embodiments, an integrated circuit includes a first conductive layer, a dielectric layer, a second conductive layer and a block layer. The first conductive layer is disposed over a substrate. The dielectric layer is disposed over the conductive layer. The second conductive layer is disposed in the dielectric layer, and electrically connected to the first conductive layer. The block layer is disposed between a sidewall of the second conducive layer and the dielectric layer, where the block layer comprises at least one rheology modifier.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A slurry composition for polishing, comprising:
   a slurry for polishing a first conductive material, wherein the slurry consists of:
      a liquid carrier;
      abrasives; and
      an oxidizer, wherein the oxidizer consists of a perborate; and
   a rheology modifier dispensed in the slurry, wherein the rheology modifier comprises an acrylic resin, and the rheology modifier comprises locust bean gum or guar gum,
wherein the abrasives, the oxidizer and the rheology modifier form a blocking layer over a second conductive material different from the first conductive material, wherein a thickness of the blocking layer ranges from about 1 angstrom to about 10 angstroms.

2. The slurry composition of claim 1, wherein the rheology modifier further comprises a cellulose derivative.

3. The slurry composition of claim 2, wherein the cellulose derivative comprises carboxymethylcellulose, hydroxyethylcellulose, or a mixture thereof.

4. The slurry composition of claim 1, further comprising at least a viscosity improver.

5. The slurry composition of claim 1, wherein the acrylic resin comprises polyacrylic acid, polyacrylamide, or a mixture thereof.

6. The slurry composition of claim 1, wherein an amount of the rheology modifier in the slurry composition is at least 20 ppm by weight.

7. The slurry composition of claim 1, wherein the oxidizer is configured to oxidize the first conductive material during a chemical mechanical polishing (CMP) operation.

8. The slurry composition of claim 1, wherein the abrasive consists of inorganic particles.

9. The slurry composition of claim 1, wherein the liquid carrier is vaporizable during a CMP operation.

10. A slurry composition for polishing consisting of:
a liquid carrier;
abrasives;
an oxidizer, wherein the oxidizer consists of a perborate;
a rheology modifier; and
a viscosity improver interlocked with the rheology modifier to increase a viscosity of the slurry composition to greater than about 1.1 mPa·s, wherein the rheology modifier consists of an acrylic resin, locust bean gum and guar gum,
wherein the abrasives and the one oxidizer are configured to polish a first conductive material,
wherein at the viscosity of the slurry composition greater than about 1.1 mPa·s, the abrasives, the oxidizer, the rheology modifier and the viscosity improver form a blocking layer over a second conductive material different from the first conductive material, and
wherein a thickness of the blocking layer ranges from about 1 angstrom to about 10 angstroms.

11. The slurry composition of claim 10, wherein the rheology modifier consists of a cellulose derivative.

12. The slurry composition of claim 11, wherein the cellulose derivative consists of carboxymethylcellulose, hydroxyethylcellulose, and a mixture thereof.

13. The slurry composition of claim 10, wherein the viscosity improver consists of least one divalent ion, at least one trivalent ion and a mixture thereof.

14. The slurry composition of claim 10, wherein the acrylic resin consists of polyacrylic acid, polyacrylamide, and a mixture thereof.

15. The slurry composition of claim 10, wherein an amount of the rheology modifier in the slurry composition is at least 20 ppm by weight.

16. The slurry composition of claim 10, wherein the oxidizer is configured to oxidize the first conductive material during a CMP operation.

17. The slurry composition of claim 10, wherein the liquid carrier is vaporizable during a CMP operation.

18. A slurry composition for polishing consisting of:
a liquid carrier;
abrasives;
an oxidizer;
a rheology modifier; and
a viscosity improver interlocked with the rheology modifier,
wherein the rheology modifier consists of an acrylic resin, locust bean gum and guar gum, and an amount of the acrylic resin in the slurry composition is equal to or greater than 100 ppm, and less than 500 ppm by weight,
wherein the abrasives and the oxidizer are configured to polish a first conductive material,
wherein the abrasives, the oxidizer, the rheology modifier and the viscosity improver form a blocking layer over a second conductive material different from the first conductive material, and
wherein a thickness of the blocking layer ranges from about 1 angstrom to about 10 angstroms.

19. The slurry composition of claim 18, wherein the blocking layer is formed between the first conductive material and a dielectric material.

20. The slurry composition of claim 18, wherein the thickness of the blocking layer is less than dimensions of the abrasives.

* * * * *